United States Patent [19]
Padmanaban et al.

[11] Patent Number: 5,846,690
[45] Date of Patent: Dec. 8, 1998

[54] RADIATION-SENSITIVE COMPOSITION CONTAINING PLASTICIZER

[75] Inventors: Munirathna Padmanaban; Yoshiaki Kinoshita; Hiroshi Okazaki; Seiya Masuda; Natsumi Kawasaki; Satoru Funato; Georg Pawlowski, all of Saitama, Japan

[73] Assignee: Hoechst Japan Limited, Tokyo, Japan

[21] Appl. No.: 615,831

[22] Filed: Mar. 14, 1996

[30] Foreign Application Priority Data

Mar. 28, 1995 [JP] Japan .................................. 7-094299

[51] Int. Cl.⁶ .............................. G03F 7/038; G03F 7/30
[52] U.S. Cl. ................................ 430/284.1; 430/270.1; 430/283.1; 430/285.1; 430/176; 430/188; 430/192; 430/326; 430/325
[58] Field of Search ............................. 430/270.1, 283.1, 430/284.1, 285.1, 176, 188, 192, 326, 325

[56] References Cited

U.S. PATENT DOCUMENTS

| | | | |
|---|---|---|---|
| 5,069,998 | 12/1991 | Schwalm et al. | 430/270.1 |
| 5,340,682 | 8/1994 | Pawlowski et al. | 430/165 |
| 5,342,727 | 8/1994 | Vicari et al. | 430/157 |
| 5,460,917 | 10/1995 | Kobayahi et al. | 430/165 |
| 5,498,506 | 3/1996 | Wengenroth et al. | 430/270.14 |
| 5,525,453 | 6/1996 | Przybilla et al. | 430/170 |

FOREIGN PATENT DOCUMENTS

| | | |
|---|---|---|
| 0 249 139 | 12/1987 | European Pat. Off. . |
| 0-307-751 | 3/1989 | European Pat. Off. . |
| 0-307-752 | 3/1989 | European Pat. Off. . |
| 0 416 873 A2 | 9/1989 | European Pat. Off. . |
| 0 611 998 A2 | 6/1994 | European Pat. Off. . |
| 0 611 998 A2 | 8/1994 | European Pat. Off. . |
| 0 677 788 A1 | 10/1995 | European Pat. Off. . |
| 0 710 885 | 5/1996 | European Pat. Off. . |
| 07-219217 | 8/1985 | Japan .................. 430/270.1 |
| 04-80758 | 3/1992 | Japan .................. 430/270 |
| 06-266100 | 9/1994 | Japan .................. 430/270.1 |

OTHER PUBLICATIONS

Grant et al (ed), *Grant and Hackh's Chemical Dictionary*, Fifth Edition, McGraw–Hill Company, New York, New York) 1987, pp. 568–569.
Jerry March, *Advanced Organic Chemistry: Reactions Mechanisms, and Structure*, 2nd Ed., McGraw–Hill Company, New York–, N.Y., 1977, pp. 225–245.
Patent Abstract of Japan vol. 17, No. 498 (P–1609), 8 Sep. 1993 & JP–A–05–127369 (NEC.
Translation of reference: Basics and application of vinyl phenol pp. 71–72, (1971) edited by Research Center of Maruzen Petrochemical Co. Ltd.

S.A. McDonald et al., "Airborne Chemical Contamination of a Chemically Amplified Resist", SPIE vol. 1466 Advances in Resist Technology and Processing VIII (1991), pp. 2–13.
F. M. Houlihan et al., "An Evaluation of Nitrobenzyl Ester Chemistry for Chemical Amplification Resists", SPIE vol. 920 Advances in Resist Technology and Processing V (1988), pp. 67–74.
Crivello, "Possibilities for Photoimaging Using Onium Salts", Polymer Engineering and Science, Mid–Dec, 1983, vol. 23, No. 17, pp. 953–956.
Ito et al., "Chemical Amplification in the Design of Dry Developing Resist Materials", Polymer Engineering and Science, Dec. 1983, vol. 23, No. 18, pp. 1012–1018.
Pawloski et al., "Chemical Amplification & Dissolution Inhibition: A Novel High Performance Positive Tone Deep UV Resist", Journal of Photopolymer Science and Technology vol. 5, No. 1 (1992), pp. 55–66.
Hattori et al., "Time Delay Effect on a Positive Deep UV Resist Using Partially Tetrahydropyranyl–protected Polyvinylphenol", Journal of Photopolymer Science and Technology, vol. 6, No. 4 (1993), pp. 497–504.
Ito et al., "Approach Toward Environmental Stabilization of Chemical Amplification Resists", Journal of Photopolymer Science and Technology, vol. 6, No. 4 (1993), pp. 547–562.
Wilson, "Organic Resist Materials—Theory and Chemistry", 1983 American Chemical Society, pp. 89–159.
Schlegel et al., "Determination of Acid Diffusion in Chemical Amplification Positive Deep–UV Resists", Japanese Journal of Applied Physics, vol. 30, No. 11B, Nov. 1991, pp. 3132–3137.

Primary Examiner—Cynthia Hamilton
Attorney, Agent, or Firm—Foley & Lardner

[57] ABSTRACT

A radiation-sensitive composition is disclosed which includes (a) a binder insoluble in water but soluble in or capable of being swelled in an aqueous alkali solution, (b) a dissolution inhibitor composed of (b1) a poly(N,O-acetal) having a general formula:

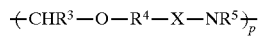

$$\text{---}(\text{CHR}^3\text{---}\text{O}\text{---}\text{R}^4\text{---}\text{X}\text{---}\text{NR}^5)_p\text{---}$$

wherein $R^3$ is alkyl or substituted or unsubstituted aryl, $R^4$ is a divalent group selected from alkylene, cycloalkylene, alkene or alkyne, $R^5$ is alkyl, alkene, alkyne or cycloalkyl, X is —OCO—, —CO— or —NHCO—, and p is a number not less than 1, and/or (b2) a phenol compound having a hydroxyl group which is protected by a group which can be cleaved in the presence of an acid, (c) a photosensitive compound capable of generating an acid when exposed to an active radiation, (d) a base capable of being decomposed when exposed to an active radiation to form a neutral compound derived therefrom, (e) a plasticizer, and (f) a solvent.

14 Claims, No Drawings

RADIATION-SENSITIVE COMPOSITION CONTAINING PLASTICIZER

BACKGROUND OF THE INVENTION

This invention relates to a radiation-sensitive composition suitable for the manufacture of electronic elements, printing plates or the like.

In recent semiconductor-chip manufacturing processes, the chip dimension has been increasingly reduced. In consequence, there is a demand for improved lithographic techniques which may be applicable to the production of patterns whose size is less than micron. Such improved lithographic techniques known in the art have used an exposure means such as those using a high-energy ultra-violet light (248 nm, 193 nm, etc.), an electron beam, an X-ray or the like. In addition, the improved lithographic techniques have caused change in requirements for properties or characteristics of a radiation-sensitive (resist) mixture used therein. For example, the requirements therefor have been documented in C. G. Wilson, "Organoresist Material-Theory and Chemistry" in the literature "Micro-Lithography Guidance; Theory, Material and Treatment" (L. F. Thompson, C. G. Wilson and M. J. Bowden ACS Symp. Ser., 219: 87(1983), American Chemical Society, Washington). Pursuant to the documented article, there has been an intense demand for a radiation-sensitive mixture exhibiting a sensitivity to a light with a wide spectral range and applicable to not only conventional photolithographic techniques but also recent improved techniques in which a middle ultra-violet light (mid UV) or a deep ultra-violet light (deep UV), an electron beam or an X-ray is used.

In order to produce a radiation-sensitive mixture exhibiting a high sensitivity to a high-energy radiation, a chemically sensitized resist has been widely used. Such a radiation-sensitive mixture is first disclosed in H. Ito and C. G. Wilson, "Polym. Eng. Sci.," Vol. 23, 1012 (1983). Generally, individual protons generated upon irradiation are caused to react catalytically with the radiation-sensitive mixture at room or higher temperature depending on its chemical composition. This catalytic reaction imparts a high sensitivity to the radiation-sensitive mixture and is generally known as chemically amplified resists (CAR) to those involved in this field.

In semiconductor industries, it is assumed that the radiation-sensitive mixture (hereinafter referred to merely as "resist mixture") must be developed by using an alkali solution. The alkali solution is suitably an organic base solution such as an aqueous solution containing 2 to 3% by weight of tetramethyl ammonium hydroxide (TMAH).

In order to render the resist mixture developable with such an alkali solution, it is most desirable that the resist mixture contains a novolak resin or a homopolymer or a copolymer of vinyl phenol. In a photolithography, the use of the novolak resin is limited to the case where a radiation having a wave length greater than 300 nm is used, because the resin exhibits a high absorption to those having a short wave length. That is, the high absorption of the novolak resin adversely affects a quality of the product so that a resist image-forming wall portion has an extremely inclined surface. On the other hand, a vinyl phenol resin can be used in a deep UV lithography only in the case where it has a desired dissolving characteristic and a high optical permeability in combination. Poly-(4-vinyl phenol) exhibits a considerably high solubility when used singly, and therefore is unsuitable for such a use per se. One method for reducing the solubility to a proper level is such that 4-vinyl phenol is copolymerized with other alkyl-substituted vinyl phenol. Such copolymers are disclosed in European patent application laid-open publications Nos. 307,752 and 307,751, and Japanese patent application laid-open publication No. 2-166,105 (1990). Other copolymers of 4-hydroxy-styrene are disclosed in Maruzen Petrochemical kabushiki-kaisha Laboratory "Basis and Application of Vinyl Phenol," (1991) p. 71.

Essentially, there is known two methods for using poly (4-vinyl phenol) soluble in an alkali solution and copolymers thereof as the resist mixture. The first conventional method includes adding completely or partly a protective group capable of being cleaved in the presence of an acid, to a hydroxyl group to render the polymer soluble in an alkali solution. In this method, a mixture of such a protected polymer, a solvent and a photo-acid-generating agent described below is first produced. The mixture is exposed to a radiation to generate an acid so that a protective group having a sensitivity to the acid, is released from the hydroxyl group.

The protective groups used in the aforementioned first conventional method include a t-butyloxycarbonyloxy group and derivatives thereof (Ito et al., "J. Photopolym. Scie. & Tech.," Vol. 6, No. 4 (1993) pp. 547), or a tetrahydropyranyl group (Hattori et al., "J. Photopolym. Scie. & Tech.," Vol. 6, No. 4 (1993) pp. 497). The second conventional method is such that poly-(4-vinylphenol) is mixed with a dissolution inhibitor such as polyacetal, which is sensitive to an acid, as disclosed by Pawlowski et al. in "J. Photopolym. Scie. & Tech.," Vol. 15, No. 1 (1992) pp. 55. The mixture is insoluble in an aqueous alkali developer before exposure to a light. However, when exposed to a deep ultra-violet light, the mixture is rendered soluble in the aqueous alkali developer since the dissolution inhibitor is cleaved thereupon.

In addition, there is known the so-called photo-acid-generating agent, which is a compound capable of generating a strong acid by the light irradiation, such as a diazonium salt, a phosphonium salt, sulfonium salt of non-nucleophilic acid such as $HSbF_6$ or $HAsF_6$ as disclosed in J. V. Crivello, "Polym. Eng. Scie.," Vol. 23 (1983) p. 953. Moreover, other compounds known as photo-acid-generating agents include halogen compounds such as, especially, trichloromethyl-triazine derivatives and trichloromethyl-oxadiazole derivatives, o-quinone-diazido-sulfochloride, o-quinone-diazido-4-sulfonic acid ester, a mixture of an organic metal and an organic halogen, bis-(sulfonyl)-diazomethane, sulfonylcarbonyl-diazomethane (refer to DE-A 3,930,087) or nitrobenzyltosylate, as disclosed in F. M. Houlihan et al., "SPIE Proc., Adv. in Resist Tech. and Proc.," Vol. 920 (1988) p. 67.

Principally, the chemically-sensitizable photoresist could be satisfactorily produced by mixing a matrix resin soluble in an aqueous alkali solution, a dissolution inhibitor and the photo-acid-generating agent with each other in a common solvent. In this case, the dissolution inhibitor is not required in case there is used, as the matrix resin, a poly-(hydroxystyrene)-based resin which contains the phenol group protected by an acid-sensitive protective group.

Chemically amplified resists suffer from latent acid image instability due to the diffusion and loss of generated acid causing the width slimming or T-top formation. These deficiencies become remarkable when delay is caused during a baking process upon and after the exposure to a light. Measures to overcome these problems have been widely suggested in the published literatures, for example, in "Airborne Chemical Contamination of a Chemically Amplified Resist," in S. A. MacDonald et al., "Advances in Resist Technology and Processing," and in Hiroshi Ito, "Proc. SPIE," Vol.2, No.12(1991) pp.1466. In addition, L. Schlegel et al. have studied another problem concerning diffusion of chemically sensitized resist materials (refer to L. Schlegel et al., "Japanese Journal of Applied Physics,", Series 5 (1991) pp. 175–180).

To avoid such problems, it has been suggested that additives such as a photo-base or a photodegradable base material are added to the conventional composition prevent reduction in the line width (Japanese patent application laid-open publication No. 5-25,753 filed on Feb. 15, 1993). However, the resist mixture does not necessarily have a sufficient focus latitude (Depth of focus).

SUMMARY OF THE INVENTION

It is therefore an object of the present invention to provide a radiation-sensitive composition having a large focus latitude (depth of focus), a high transmittance of deep ultraviolet light, KrF-excimer-laser beam or the like and a high sensitivity to a light beam, an electron beam and an X-ray, and exhibiting an excellent heat resistance and an excellent adhesion to a substrate, whereby a given pattern can be obtained at high accuracy but without deterioration in dimension thereof with an elapsed time.

In accordance with the present invention, there is provided a radiation-sensitive composition comprising;

(a) a binder insoluble in water but soluble in or capable of being swelled in an aqueous alkali solution, (b) a dissolution inhibitor composed of (b1) a poly(N,O-acetal) having the following formula (I):

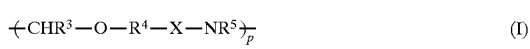

wherein $R^3$ is alkyl or substituted or unsubstituted aryl, $R^4$ is a divalent group selected from alkylene, cycloalkylene, alkene or alkyne, $R^5$ is alkyl, alkene, alkyne or cycloalkyl, X is —OCO—, —CO— or —NHCO—, and p is a number not less than 1, and/or (b2) a phenol compound having a hydroxyl group which is protected by a group which can be cleaved in the presence of an acid, (c) a photosensitive compound capable of generating an acid when exposed to an active radiation;

(d) a base capable of being decomposed when exposed to an active radiation to form a neutral compound derived therefrom;

(e) a plasticizer; and (f) a solvent.

The radiation-sensitive composition according to the present invention is used, for example, in the form of a film which is coated on a substrate. The film is selectively exposed to a light and thereafter is subjected to heating and developing treatments to obtain a pattern thereon. Development of the positive-type film is carried out by removing an exposed portion thereof while development of the negative-type film is carried out by removing unexposed portion thereof. In the case of a negative-type film, the component (b) may be replaced with a cross-linking agent. Examples of such cross-linking agents include, for example, hexamethoxymethylmelamine. In addition, the radiation-sensitive composition according to the present invention is suitably used in manufacture of semiconductors due to a high sensitivity, a high adhesion to a substrate and a high process latitude thereof. In this case, the radiation composition can be developed by using an aqueous alkali solution which is generally used as a developer in conventional semiconductor-manufacturing processes.

The above and other features and objects of the present invention will become more apparent from the following detailed description and the appended claims.

DETAILED DESCRIPTION OF THE PREFERRED EMBODIMENTS OF THE INVENTION

The radiation-sensitive composition according to the present invention contains the components (a) to (f) as described above.

The binder (component (a)) used in the radiation-sensitive composition according to the present invention, includes, for example, polymers containing a phenol group, polyacrylic acid derivatives, polymethacrylic acid derivatives, polyvinyl alcohol or the like. The preferred binder is a polymer containing a phenol group such as poly(4-hydroxystyrene). The hydroxyl group of poly(4-hydroxystyrene) is protected partially by a protective group which can be cleaved in the presence of an acid. Examples of the preferred protective groups include t-butyloxycarbonyl, ethoxyethyl, tetrahydropyranyl, trialkylsilyl or the like.

Typical examples of the binder (component (a)) include a homopolymer or a copolymer of 4-hydroxystyrene. In the case of the copolymer, co-monomers thereof may be generally available monomers such as styrene, acrylic acid ester or the like. For example, the co-monomers may be alkylated derivatives such as styrene, 3-methyl-4-hydroxy-styrene, tetrahydropyranyloxystyrene or t-butoxycarbonyloxy-styrene. Examples of the preferred co-monomers include poly(hydroxystyrene), poly(4-hydroxystyrene-co-3-methyl-4-hydroxystyrene) or poly-(4-hydroxystyrene-co-styrene). The co-monomers are more preferably those containing 2 to 50% by weight of styrene.

The dissolution inhibitor (component (b)) may be composed of monomers or polymers. The suitable polymers are those capable of being decomposed to monomeric units by an acid at room or higher temperature. The dissolution inhibitor should have an ability to prevent dissolution of the binder (component (a)) in an aqueous alkali solution. In case the dissolution inhibitor is poly(N, O-acetal) having the aforementioned general formula (I), they may be produced by subjecting an urethane-alcohol component and aldehyde dimethylacetal to an ester interchange reaction in the presence of an acid catalyst. The condensation degree and molecular weight distribution thereof may be controlled by varying the polycondensation conditions. Further, the dissolution inhibitor may be a phenol compound having a hydroxyl group protected by a group which can be cleaved in the presence of an acid. Examples of suitable phenol compounds include poly-(hydroxystyrene), poly-(4-hydroxystyrene-co-3-methyl-4-hydroxystyrene) and poly-(4-hydroxystyrene-co-styrene). Examples of preferred protective groups for the hydroxyl group of the phenol compound include t-butyloxycarbonyl, ethoxythyl, tetrahydropyranyl and trialkylsilyl.

Incidentally, there can be used a single compound which has not only the functions of the component (a) including an alkaline solution solubility, film-formation and thermal stability but also those of the component (b) including an ability to prevent the dissolution of aforementioned phenol-type resin (a) in an aqueous alkali solution. In such. a case, a single compound can be produced by the covalent-bonding of an acid-sensitizable group such as a tetrahydropyranyl group and a t-butoxycarbonyl group to the hydroxy group of the phenol compound. Thus, when the component (a) is a polymer containing phenol groups whose hydroxyl groups are sufficiently protected by protective groups which can be cleaved in the presence of an acid, the addition of the component (b) may be omitted. The content of the hydroxyl groups protected by the protective group may be 0 to 60 mol % based on a total amount of the hydroxyl groups contained in the components (a) and (b).

The photosensitive compound (component (c)) is one capable of generating an acid when exposed to an active radiation. Examples of suitable photosensitive compounds include a diazomethane compound, an iodonium salt, a sulfonium salt, a halogen compound and an o-quinone-diazido-sulfonic acid ester. The preferred photosensitive compounds (c) are those represented by the general formula (III):

$$Ar-SO_2-C(N_2)-Y-Ar' \quad (III)$$

wherein Ar and Ar' are independently phenyl, chlorophenyl, toluene, alkyl or the combination thereof, and Y is —$SO_2$—, —CO— or $(Ar'')_3S^+R^6SO_3^-$ wherein Ar" is phenyl and $R^6$ is alkyl or halogenated alkyl. More preferably, the photosensitive compound is one which is capable of generating a sulfonic acid, and has a proper thermal stability and an advantageous absorption to a radiation beam having a wave length of preferably 220 to 380 nm, particularly preferably 248 nm. Important compounds as the photosensitive compound include a phenol-based sulfonic acid ester, bis-sulfonyl methane and bis-sulfonyl diazomethane.

Above all, particularly preferred are sulfonic acid-sulfonium compounds such as sulfonic acid-triarylsulfonium, bis-(4-chlorophenylsulfonyl) diazomethane and sulfonic acid-camphorsulfonium. Specific examples of the sulfonic acid-sulfonium compounds may include alkylsulfonic acid-triphenyl-sulfonium, alkyl- or halogen-substituted arylsulfonic acid-triphenylsulfonium and fluorinated alkylsulfonic acid-triphenyl-sulfonium.

The preferred photosensitive base (component (d)) may be an onium salt containing an acetate ion (anion), a sulfonium ion and an ammonium ion. Particularly useful compounds as the base may include triaryl sulfonium and derivatives thereof, and diphenyliodonium and derivatives thereof. The amount of the base (component (d)) used in the radiation-sensitive composition of the present invention varies depending upon the absorption thereof and the amount of the photo-acid-generating agent (c) used.

The preferred plasticizer (component (e)) may include those ester compounds represented by the general formula II:

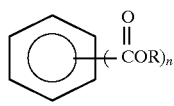

wherein R is substituted or unsubstituted alkyl having 1 to 20 carbon atoms, and n is a number of 1 or 2.

Specific examples of the preferred radical R in the above general formula (II) may include alkyl groups such as methyl, ethyl, n-hexyl and n-octyl, cycloalkyl groups such as cyclohexyl and a hydroxyalkyl group. In this case, a hydrogen atom of the radical R may be substituted with —OH or a halogen atom such as F or Cl.

The aforementioned compounds used as the component (e) are useful to enhance a compatibility between components in the resist (radiation-sensitive) composition, improve the adhesion thereof to a substrate and increase a contrast of the pattern formed on the resist composition, whereby the resist composition can exhibit improved resolution and depth of focus. Further, such compounds serve to plasticize the components (a) and (b) to enhance a film-forming ability of the resist composition. Incidentally, in order to improve the storage stability of a film composed of the resist composition, there are occasions that a wafer on which the resist composition is coated, is subjected to an annealing or pre-baking in which the resist composition is heated to its glass transition temperature, Tg, or higher. In this case, resist compositions containing low thermally stable components decompose before reaching the glass transition temperature, Tg, of the resist composition. On the other hand, in case the plasticizer is added to the resist composition, the glass transition temperature, Tg, thereof is lowered, whereby the composition can be subjected to the heat treatment without suffering from such a thermal decomposition. Specific examples of the plasticizer (component (e)) include, though not restricted thereto, terephthalic acid-bis-(2-hydroxyethyl) ester, phthalic acid-di-n-octyl ester, benzoic acid-n-hexyl ester, N-methylcarbamic acid-2-hydroxyethyl ester, N-propylcarbamic acid-2-hydroxyethyl ester, N-propylcarbamic acid-3-hydroxy-2, 2-dimethylpropyl ester, N-cyclohexylcarbamic acid-2-hydroxyethyl ester and N-n-hexylcarbamic acid-2-hydroxyethyl ester.

The solid content of the radiation-sensitive composition, which is equal to a total content of the components (a) to (e), is in the range of 10 to 50% by weight, preferably 15 to 25% by weight based on a total amount of the radiation-sensitive composition. The weight ratio of the component (a) to the component (b) is in the range of 100:0 to 50:50, depending upon molecular weights and chemical properties of the components (a) and (b), and a solubility of the component (a) to an aqueous alkali developer. When the thus-formulated radiation-sensitive composition is applied to a pattern formation in manufacture of a semiconductor, a film composed of such a radiation-sensitive composition can be uniformly coated over a substrate wafer such as silicon.

In addition, the weight ratio of the component (a) to the component (b) is preferably determined depending upon a dissolution rate of the component (a) into an aqueous alkali solution. Particularly preferred weight ratio of the component (a) to the component (b) is in the range of 80:20 to 60:40.

The amount of the component (c) is in the range of 0.2 to 5% by weight, preferably 1 to 3% by weight, based on a total amount of the components (a) and (b). In this case, it should be noted that the absorption of the component (c) is an important factor for determining its amount used in the composition. Further, a necessary amount of the component (d) is determined depending upon the amount of the component (c). The amount of the component(e) used is preferably in the range of 0.1 to 10% by weight, more preferably 1 to 5% by weight. The absorption of the plasticizer (component (e)) is one of the important properties. Specifically, the plasticizer may be made of a materiel having a low absorption to a wave length of radiated light.

Although a mixture of only the components (a) to (d) dissolved in a generally used solvent provides a resist material, the addition of the component (e) can achieve an improvement in a film-forming ability, an adherence, a resolution and a depth of focus of the resist material.

The solvent (component (f)) is not restricted to any particular solvent as far as the solvent can dissolve the components (a) to (e). From the standpoint of safety, dissolution, a boiling point, and film-forming ability, examples of preferred solvents may include propylene glycol-monomethyl-ether acetate (PGMEA), ethyl lactate (EL)-Cellosolve acetate or the like.

In the radiation-sensitive composition according to the present invention, each of the components (a) to (f) is used singly or in the form of a mixture of two or more different compounds.

The radiation-sensitive composition according to the present invention can be used for pattern formation in the manufacture of semiconductor devices. In this case, the pattern formation is performed as follows.

First, the radiation-sensitive composition according to the present invention, is coated over a substrate such as a silicon wafer to form a film thereof having a thickness of 500 to 2,000 nm. The film is placed in an oven and then heated at 60° to 150° C. for 10 to 30 minutes. Alternatively, the film may be placed on a hot plate and then baked at 60° to 150° C. for 1 to 2 minutes. The resultant resist film is masked with a masking material for forming a desired pattern thereon. The masked resist film is then exposed to a deep ultra-violet light having a wave length of 300 nm or less at an exposing amount of about 1 to 100 mJ/cm$^2$. Successively, the deep UV-exposed film is developed with a developer solution such as an aqueous solution containing 0.1 to 5% of tetramethyl ammonium hydroxide (TMAH) for 0.5 to 3 minutes by using either an immersion method, a spraying method, a puddle method or other usual methods, whereby the desired pattern is formed on the substrate.

The present invention will be described in more detail below by way of examples. Percentages appearing throughout the examples are indicated on the weight basis.

REFERENCE EXAMPLE 1

Synthesis of poly-N,O-acetal 59.11 g of propylamine was gradually added dropwise from a funnel into 102.09 g of 4-methyl-1,3-dioxorane-2-on to react with each other. In the reaction, the reaction mixture was maintained at 25° C. room temperature while cooling occasionally. After completing the addition of amine, the reaction mixture was heated to 70° C. and maintained at that temperature for 5 hours. The thus-produced compound A was purified by distillation. As a result, it was confirmed that the compound A had a boiling point of 114° to 115° C. at 0.4 Torr. The yield of the compound A was 159.6 g (99%)

By using xylene as a reaction solvent, the compound A was reacted with benzaldehyde-dimethyl-acetal in the presence of Amberlyst 15 as an acid catalyst at 130° C. at a molar ratio of 1:1. The produced water was removed in the form of an azeotrope while occasionally adding xylene to the reaction system. when 8 hours elapsed after the initiation of the reaction, the acid catalyst (Amberlyst 15) was removed by filtering and xylene was distilled off from the reaction system. The reaction mixture was further heated at reduced pressure (0.001 Torr) and thereafter a low molecular weight moiety thereof was removed at 160° C. by using a thin layer evaporator.

REFERENCE EXAMPLE 2

A resist composition composed of the following components was prepared:

| | |
|---|---|
| Poly(4-hydroxystyrene-co-styrene) (Mw = 15,000) | 5.67 g |
| Polyacetal prepared in Reference Example 1 | 3.15 g |
| α,α-Bis(p-chlorophenyl)diazomethane | 0.18 g |
| Propylene glycol monomethyl ether acetate (PGMEA) solution of 0.1 mmol/g acetic acid-triphenyl sulfonium | |
| PGMEA | 41 g |

The mixture was stirred for one hour or more and then filtered by using 0.5 μm and 0.2 μm-filters to remove particles. The resist solution was spin-coated on a silicon wafer or any other semiconductor substrate, and thereafter prebaked at 130° C. for 60 seconds to obtain a resist having a thickness of 0.746 μm. The silicon wafer coated with the resist was selectively exposed to a KrF excimer-laser beam having a wave length of 248.4 nm by using a mask and a stepper having a numerical aperture of 0.5. The exposed resist was baked on a hot plate at 55° C. for 155 seconds, and then developed for 60 seconds with an alkali developer (containing 2.38% by weight of tetramethyl ammonium hydroxide) to dissolve the exposed portion of the resist material therein and remove it from the silicon substrate. As a result, a positive pattern of the resist material was obtained on the silicon substrate. The thus-obtained positive pattern had an aspect ratio of almost 90°, a resolution of 0.24 μm in line and space, an exposure energy of 32.1 mJ/cm$^2$ and a depth of focus of 0.9 μm. at 0.3 μm in line and space.

REFERENCE EXAMPLE 3

The procedures of Reference Example 2 were repeated in the same manner as described except that the below-mentioned components were used to prepare a resist composition.

| | |
|---|---|
| Poly(4-hydroxystyrene-co-3-methyl-4-hydroxystyrene) (Mw = 10,000, content of 4-hydroxystyrene: 60 mol %) | 5.67 g |
| Polyacetal prepared in Reference Example 1 | 3.15 g |
| α,α-bis(p-chlorophenyl)diazomethane | 0.136 g |
| PGMEA solution of 0.1 mmol/g acetic acid-triphenyl sulfonium | 2.09 g |
| PGMEA | 41 g |

The thus-obtained positive pattern had an aspect ratio of almost 90°, a resolution of 0.24 μm in line and space, an exposure energy of 52 mJ/cm$^2$ and a depth of focus of 0.9 μm at 0.3 μm in line and space.

REFERENCE EXAMPLE 4

The procedures of Reference Example 2 were repeated in the same manner as described except that the below-mentioned components were used to prepare a resist composition.

| | |
|---|---|
| Poly-(4-hydroxystyrene-co-3-methyl-4-hydroxystyrene) (Mw = 15,000, content of 4-hydroxystyrene: 65 mol %) | 6.3 g |
| Polyacetal prepared in Reference Example 1 | 2.7 g |
| α,α-bis(p-chlorophenyl)diazomethane | 0.205 g |
| PGMEA solution of 0.1 mmol/g acetic acid-triphenyl sulfonium | 4.05 g |
| PGMEA | 41 g |

The thus-obtained positive pattern had an aspect ratio of almost 90°, a resolution of 0.24 μm in line and space, an exposure energy of 52 mJ/cm$^2$ and a depth of focus of 0.9 μm at 0.3 μm in line and space.

REFERENCE EXAMPLE 5

The procedures of Reference Example 2 were repeated in the same manner as described except that the below-mentioned components were used to prepare a resist composition.

| | |
|---|---|
| Poly(4-hydroxystyrene-co-3-methyl-4-hydroxystyrene) (Mw = 10,000, content of 4-hydroxystyrene: 60 mol %) | 6.3 g |
| Polyacetal prepared in Reference Example 1 | 2.7 g |
| Hexafluoropropyl-sulfonic acid-triphenyl-sulfonium | 0.205 g |
| PGMEA solution of 0.1 mmol/g acetic acid-triphenyl sulfonium | 4.05 g |
| PGMEA | 41 g |

The thus-obtained positive pattern had an aspect ratio of almost 90°, a resolution of 0.24 μm in line and space, an exposure energy of 52 mJ/cm$^2$ and a depth of focus of 0.9 μm at 0.3 μm in line and space.

EXAMPLE 1

A resist composition composed of the following components was prepared:

| | |
|---|---|
| Poly(4-hydroxystyrene-co-styrene) (Mw = 15;000; styrene content: 5 mol %) | 5.67 g |
| Polyacetal prepared in Reference Example 1 | 3.15 g |
| α,α-bis(p-chlorophenyl)diazomethane | 0.18 g |
| PGMEA solution of 0.1 mmol/g acetic acid-triphenyl sulfonium | 2.76 g |
| Bis(2-hydroxyethyl) terephthalate | 0.0882 g |
| PGMEA | 40 g |

The composition was stirred for one hour or more and then filtered by using 0.5 μm- and 0.2 μm-filters to remove solid particles. The thus-obtained resist solution was spin-coated on a silicon wafer or any other semiconductor substrate, and thereafter prebaked at 130° C. for 60 seconds to obtain a film-like resist material having a thickness of 0.746 μm. The silicon wafer coated with the resist material was selectively exposed to a KrF excimer-laser beam having a wave length of 248.4 nm by using a mask and a stepper having a numerical aperture of 0.45. The exposed resist material was baked on a hot plate at 55° C. for 155 seconds, and then developed for 60 seconds with an alkali developer (containing 2.38% by weight of tetramethyl ammonium hydroxide) to dissolve the exposed portion of the resist material therein and remove it from the silicon substrate. As a result, a positive pattern of the resist material was obtained on the silicon substrate. The thus-obtained positive pattern had an aspect ratio of almost 90°, a resolution of 0.22 μm in line and space and a depth of focus of 1.5 μm at 0.3 μm in line and space.

EXAMPLE 2

The procedures of Example 1 were repeated in the same manner as described except that the below-mentioned components were used to prepare a resist composition.

| | |
|---|---|
| Poly(4-hydroxystyrene-co-3-methyl-4-hydroxystyrene) (Mw = 10,000, content of 4-hydroxystyrene: 60 mol %) | 5.67 g |
| Polyacetal prepared in Reference Example 1 | 3.15 g |
| α,α-bis(p-chlorophenyl)diazomethane | 0.136 g |
| PGMEA solution of 0.1 mmol/g acetic acid-triphenyl sulfonium | 2.09 g |
| Bis(2-hydroxyethyl) terephthalate | 0.0441 g |
| PGMEA | 41 g |

The thus-obtained positive pattern had an aspect ratio of 90°, a resolution of 0.20 μm in line and space and a depth of focus of 1.7 μm at 0.3 μm in line and space.

EXAMPLE 3

The procedures of Example 1 were repeated in the same manner as described except that the below-mentioned components were used to prepare a resist composition.

| | |
|---|---|
| Poly(4-hydroxystyrene-co-3-methyl-4-hydroxystyrene) (Mw = 15,000, content of 4-hydroxystyrene: 65 mol %) | 6.12 g |
| Polyacetal prepared in Reference Example 1 | 2.7 g |
| α,α-bis(t-butylphenyl)diazomethane | 0.18 g |
| PGMEA solution of 0.1 mmol/g acetic acid-triphenyl sulfonium | 2.76 g |
| Di-n-octyl Phthalate | 0.0882 g |
| GMEA | 41 g |

The thus-obtained positive pattern of the resist material had an aspect ratio of about 90°, a resolution of 0.20 μm in line and space and a depth of focus of 1.7 μm at 0.3 μm in line and space.

EXAMPLE 4

The procedures of Example 1 were repeated in the same manner as described except that the below-mentioned components were used to prepare a resist composition.

| | |
|---|---|
| Poly(4-hydroxystyrene-co-3-methyl-4-hydroxystyrene) (Mw = 15,000, content of 4-hydroxystyrene: 65 mol %) | 6.12 g |
| Polyacetal prepared in Reference Example 1 | 2.7 g |
| Hexafluoropropyl-sulfonic acid-triphenyl sulfonium | 0.2 g |
| PGMEA solution of 0.1 mmol/g acetic acid-triphenyl sulfonium | 4 g |
| Bis(2-hydroxyethyl) terephthalate | 0.0882 g |
| PGMEA | 41 g |

The thus-obtained positive pattern of the resist material had an aspect ratio of about 90°, a resolution of 0.20 μm in line and space and a depth of focus of 1.7 μm at 0.3 μm in line and space.

EXAMPLE 5

The procedures of Example 1 were repeated in the same manner as described except that the below-mentioned components were used to prepare a resist composition.

| | |
|---|---|
| Poly(4-hydroxystyrene-co-3-methyl-4-hydroxystyrene) (Mw = 15,000; content of 4-hydroxystyrene: 65 mol %) | 5.94 g |

-continued

| | |
|---|---|
| Polyacetal prepared in Reference Example 1 | 2.7 g |
| Hexafluoropropyl-sulfonic acid-triphenyl sulfonium | 0.2 g |
| PGMEA solution of 0.1 mmol/g acetic acid-triphenyl sulfonium | 4 g |
| Bis(2-hydroxyethyl) terephthalate | 0.0441 g |
| PGMEA | 41 g |

The thus-obtained positive pattern of the resist material had an aspect ratio of about 90°, a resolution of 0.20 µm in line and space and a depth of focus of 1.7 µm at 0.3 µm in line and space.

EXAMPLE 6

The procedures of Example 1 were repeated in the same manner as described except that the below-mentioned components were used to prepare a resist composition.

| | |
|---|---|
| Poly-(4-hydroxystyrene-co-3-methyl-4-hydroxystyrene) (Mw = 15,000; content of 4-hydroxystyrene: 65 mol %) | 5.94 g |
| Polyacetal prepared in Reference Example 1 | 2.7 g |
| Hexafluoropropyl-sulfonic acid-triphenyl sulfonium | 0.2 g |
| n-Hexyl benzoate | 0.0864 g |
| PGMEA solution of 0.1 mmol/g acetic acid-triphenyl sulfonium | 4 g |
| PGMEA | 41 g |

The thus-obtained positive pattern of the resist material had an aspect ratio of about 90°, a resolution of 0.20 µm in line and space and a depth of focus of 1.7 µm at 0.3 µm in line and space.

EXAMPLE 7

The procedures of Example 1 were repeated in the same manner as described except that the below-mentioned components were used to prepare a resist composition.

| | |
|---|---|
| Poly(4-hydroxystyrene-co-3-methyl-4-hydroxystyrene) (Mw = 15,000; content of 4-hydroxystyrene: 65 mol %) | 5.67 g |
| Polyacetal prepared in Reference Example 1 | 3.15 g |
| α,α-bis(p-chlorophenyl)diazomethane | 0.18 g |
| PGMEA solution of 0.1 mmol/g acetic acid-triphenyl sulfonium | 2.76 g |
| n-Hexyl benzoate | 0.0882 g |
| PGMEA | 40 g |

The thus-obtained positive pattern of the resist material had an aspect ratio of about 90°, a resolution of 0.20 µm in line and space and a depth of focus of 1.7 µm at 0.3 µm in line and space.

EXAMPLE 8

The procedures of Example 1 were repeated in the same manner as described except that the below-mentioned components were used to prepare a resist composition.

| | |
|---|---|
| Poly(4-hydroxystyrene-co-styrene) (Mw = 15,000; styrene content: 5 mol %) | 6.12 g |
| Polyacetal prepared in Reference Example 1 | 2.7 g |
| α,α-bis(p-chlorophenyl)diazomethane | 0.18 g |
| PGMEA solution of 0.1 mmol/g acetic acid-triphenyl sulfonium | 2.76 g |
| Di-n-octyl terephthalate | 0.1764 g |
| PGMEA | 40 g |

The thus-obtained positive pattern of the resist material had an aspect ratio of about 90°, a resolution of 0.20 µm in line and space and a depth of focus of 1.7 µm at 0.3 µm in line and space.

EXAMPLE 9

The procedures of Example 1 were repeated in the same manner as described except that the below-mentioned components were used to prepare a resist composition.

| | |
|---|---|
| Poly(4-hydroxystyrene-co-3-methyl-4-hydroxystyrene) (Mw = 15,000; content of 4-hydroxystyrene: 65 mol %) | 6.12 g |
| Polyacetal prepared in Reference Example 1 | 2.7 g |
| α,α-bis (p-chlorophenyl)diazomethane | 0.18 g |
| PGMEA solution of 0.1 mmol/g acetic acid-triphenyl sulfonium | 2.76 g |
| Di-n-octyl terephthalate | 0.1764 g |
| PGMEA | 40 g |

The thus-obtained positive pattern of the resist material had an aspect ratio of about 90°, a resolution of 0.20 µm in line and space and a depth of focus of 1.5 µm at 0.3 µm in line and space.

EXAMPLE 10

The procedures of Example 1 were repeated in the same manner as described except that the below-mentioned components were used to prepare a resist composition.

| | |
|---|---|
| Poly(4-hydroxystyrene) | 6.12 g |
| Polyacetal prepared in Reference Example 1 | 2.7 g |
| α,α-bis(p-chlorophenyl)diazomethane | 0.18 g |
| PGMEA solution of 0.1 mmol/g acetic acid-triphenyl sulfonium | 2.76 g |
| Bis(2-hydroxyethyl) terephthalate | 0.1764 g |
| PGMEA | 40 g |

The thus-obtained positive pattern of the resist material had an aspect ratio of about 90°, a resolution of 0.20 µm in line and space and a depth of focus of 1.5 µm at 0.3 µm in line and space.

EXAMPLE 11

The procedures of Example 1 were repeated in the same manner as described except that the below-mentioned components were used to prepare a resist composition.

| | |
|---|---|
| Poly-(4-hydroxystyrene-co-t-butyloxy carbonyloxystyrene) (Mw = 14,000; content of 4-hydroxystyrene: 90 mol %) | 6.12 g |
| Polyacetal prepared in Reference Example 1 | 2.0 g |
| α,α-bis(p-chlorophenyl)diazomethane | 0.18 g |

-continued

| | |
|---|---|
| PGMEA solution of 0.1 mmol/g acetic acid-triphenyl sulfonium | 2.76 g |
| Bis(2-hydroxyethyl) terephthalate | 0.0812 g |
| PGMEA | 40 g |

The thus-obtained positive pattern of the resist material had an aspect ratio of about 90°, a resolution of 0.20 μm in line and space and a depth of focus of 1.5 μm at 0.3 μm in line and space.

EXAMPLE 12

The procedures of Example 1 were repeated in the same manner as described except that the below-mentioned components were used to prepare a resist composition.

| | |
|---|---|
| Poly-(4-hydroxystyrene-co-3-methyl-4-hydroxystyrene) (Mw = 15,000; content of 4-hydroxystyrene: 65 mol %) | 6.12 g |
| 2,2-bis(p-t-butoxycarbonyl-oxyphenyl)propane | 2.7 g |
| α,α-bis(t-butylphenyl)diazomethane | 0.18 g |
| PGMEA solution of 0.1 mmol/g acetic acid-triphenyl sulfonium | 2.76 g |
| Bis(2-hydroxyethyl) terephthalate | 0.0882 g |
| PGMEA | 41 g |

The thus-obtained positive pattern of the resist material had an aspect ratio (wall angle) of 87°, a resolution of 0.24 μm in line and space and a depth of focus of 1.4 μm at 0.3 μm in line and space.

As is inferred from comparison between Reference Examples 2 to 5 and Examples 1 to 12, it is confirmed that the radiation-sensitive (resist) composition containing the plasticizer (component (e)) according to the present invention exhibits improved resolution and depth of focus.

Thus, the radiation-sensitive composition according to the present invention has a good adhesion to a substrate and is superior in resolution, focus latitude, heat resistance and etching stability, whereby the composition is suitably applied to a semiconductor manufacturing process in which a pattern in the from of printed line and space can be formed on a substrate such as a silicon wafer by using a KrF excimer-laser beam.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A radiation-sensitive composition comprising:
   (a) a binder insoluble in water but soluble in or capable of being swelled in an aqueous alkali solution;
   (b) at least one of a (b1) a crosslinking agent or (b2) a dissolution inhibitor composed of (b21) a poly(N,O-acetal) having the following formula (I):

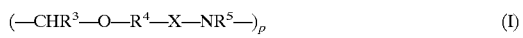

wherein $R^3$ stands for an alkyl group or a substituted or unsubstituted aryl group, $R^4$ stands for a divalent group selected from the group consisting of an alkylene group, a cycloalkylene group, an alkene group and an alkyne group, $R^5$ stands for an alkyl group, an alkene group, an alkyne group or a cycloalkyl group, X stands for —OCO—, —CO— or —NHCO—, and p is a number not less than 1, and/or (b22) a phenol compound having a hydroxyl group which is protected by a group which can be cleaved in the presence of an acid;
   (c) a photosensitive compound capable of generating an acid when exposed to an active radiation;
   (d) a base capable of being decomposed when exposed to an active radiation to form a neutral compound derived therefrom;
   (e) a plasticizer which comprises a compound of the following formula (II):

wherein R stands for a substituted or unsubstituted alkyl group having 1 to 20 carbon atoms and n is a number of 1 or 2; and
   (f) a solvent.

2. The radiation-sensitive composition according to claim 1, wherein said plasticizer is bis(2-hydroxyethyl) terephthalate, di-n-octyl phthalate, or n-hexyl benzoate.

3. The radiation-sensitive composition according to claim 1, wherein the content of said plasticizer is in the range of 1 to 5% by weight based on a total solid content of the composition.

4. A method of using the radiation-sensitive composition according to claim 1, comprising applying the composition on a substrate to form a film, exposing the film, and developing the exposed film to form a pattern.

5. The radiation-sensitive composition according to claim 1, which comprises said dissolution inhibitor (b2).

6. The radiation-sensitive composition according to claim 1, which comprises said crosslinking agent (b1).

7. The radiation-sensitive composition according to claim 1, wherein the binder comprises a homopolymer or copolymer of 4-hydroxystyrene.

8. The radiation-sensitive composition according to claim 1, which comprises said dissolution inhibitor (b21).

9. The radiation-sensitive composition according to claim 1, which comprises said dissolution inhibitor (b22).

10. A radiation-sensitive composition comprising:
    (a) a binder insoluble in water but soluble in or capable of being swelled in an aqueous alkali solution, said binder containing a phenol group whose hydroxyl group is protected by a group which can be cleaved in the presence of an acid;
    (c) a photosensitive compound capable of generating an acid when exposed to an active radiation;
    (d) a base capable of being decomposed when exposed to an active radiation to form a neutral compound derived therefrom;
    (e) a plasticizer which comprises a compound of the following formula (II):

wherein R stands for a substituted or unsubstituted alkyl group having 1 to 20 carbon atoms and n is a number of 1 or 2; and (f) a solvent.

11. The radiation-sensitive composition according to claim 10, wherein said plasticizer is bis(2-hydroxyethyl) terephthalate, di-n-octyl phthalate, or n-hexyl benzoate.

12. A method of using the radiation-sensitive composition according to claim 10, comprising applying the composition on a substrate to form a film, exposing the film, and developing the exposed film to form a pattern.

13. The radiation-sensitive composition according sto claim 10, wherein the binder comprises a homopolymer or copolymer of 4-hydroxystyrene.

14. The radiation-sensitive composition according to claim 10, wherein the content of said plasticizer is in the range of 1 to 5% by weight based on a total solid content of the composition.

* * * * *